(12) United States Patent
Wang et al.

(10) Patent No.: US 10,056,884 B2
(45) Date of Patent: Aug. 21, 2018

(54) CNFET DOUBLE-EDGE PULSE JKL FLIP-FLOP

(71) Applicant: Ningbo University, Zhejiang (CN)

(72) Inventors: Pengjun Wang, Zhejiang (CN); Qian Wang, Zhejiang (CN); Weiwei Chen, Zhejiang (CN); Daohui Gong, Zhejiang (CN)

(73) Assignee: Ningbo University, Zhejiang (CN)

( * ) Notice: Subject to any disclaimer, the term of this patent is extended or adjusted under 35 U.S.C. 154(b) by 0 days.

(21) Appl. No.: 15/470,916

(22) Filed: Mar. 28, 2017

(65) Prior Publication Data

US 2017/0353175 A1 Dec. 7, 2017

(30) Foreign Application Priority Data

Jun. 3, 2016 (CN) .......................... 2016 1 0388691

(51) Int. Cl.
*H03K 3/012* (2006.01)
*H01L 51/05* (2006.01)
*H03K 3/356* (2006.01)

(52) U.S. Cl.
CPC ......... *H03K 3/012* (2013.01); *H01L 51/0512* (2013.01); *H03K 3/356104* (2013.01)

(58) Field of Classification Search
CPC ................ H01L 51/0512; H03K 3/012; H03K 3/356104
USPC ........................................................ 327/211
See application file for complete search history.

(56) References Cited

U.S. PATENT DOCUMENTS

| | | | |
|---|---|---|---|
| 9,640,764 B2 * | 5/2017 | Wang | H01L 51/0048 |
| 2007/0014151 A1 * | 1/2007 | Zhang | B82Y 10/00 365/185.01 |
| 2008/0231361 A1 * | 9/2008 | Ludwig | B82Y 10/00 330/252 |
| 2011/0063905 A1 * | 3/2011 | Paul | B82Y 10/00 365/185.03 |
| 2011/0133284 A1 * | 6/2011 | Mitra | B08B 7/0035 257/368 |

* cited by examiner

*Primary Examiner* — William Hernandez
(74) *Attorney, Agent, or Firm* — JCIPRNET

(57) ABSTRACT

The present invention discloses a CNFET double-edge pulse JKL flip-flop, comprising a double-edge pulse signal generator, 31 CNFET tubes, 6 NTI gate circuits having the same circuit structure, 6 PTI gate circuits having the same circuit structure as well as the $1^{st}$ and $2^{nd}$ two-value inverters having the same circuit structure; it features in correct logic functions as well as high-speed and low power consumption.

5 Claims, 4 Drawing Sheets

CNFET DOUBLE-EDGE PULSE JKL FLIP-FLOP

CROSS-REFERENCE TO RELATED APPLICATION

This application claims the priority benefit of China application serial no. 201610388691.6, filed on Jun. 3, 2016. The entirety of the above-mentioned patent application is hereby incorporated by reference herein and made a part of this specification.

FIELD OF THE INVENTION

The present invention is related to a JKL flip-flop, in particular to a CNFET double-edge pulse JKL flip-flop.

BACKGROUND ART

Three-value JKL flip-flop is provided with diversified function, and it is of high significance to design a CNFET (carbon nanotube field effect transistor) double-edge pulse JKL flip-flop featuring in high speed and low power consumption.

SUMMARY OF THE INVENTION

The technical issue to be settled by the present invention is to provide a CNFET double-edge pulse JKL flip-flop featuring in high speed and low power consumption.

Technical solutions used by the present invention to settle aforesaid technical issue are stated as follows: A CNFET double-edge pulse JKL flip-flop, comprising a double-edge pulse signal generator, the $1^{st}$, $2^{nd}$, $3^{rd}$, $4^{th}$, $5^{th}$, $6^{th}$, $7^{th}$, $8^{th}$, $9^{th}$, $10^{th}$, $11^{th}$, $12^{th}$, $13^{th}$, $14^{th}$, $15^{th}$, $16^{th}$, $17^{th}$, $18^{th}$, $19^{th}$, $20^{th}$, $21^{st}$, $22^{nd}$, $23^{rd}$, $24^{th}$, $25^{th}$, $26^{th}$, $27^{th}$, $28^{th}$, $29^{th}$, $30^{th}$ and $31^{st}$ CNFET tubes, 6 NTI gate circuits of the same circuit structure, 6 PTI gate circuits of the same circuit structure, the $1^{st}$ and $2^{nd}$ three-value inverters of the same circuit structure; the 6 NTI gate circuits comprise the $1^{st}$, $2^{nd}$, $3^{rd}$, $4^{th}$, $5^{th}$ and $6^{th}$ NTI gate circuits; the 6 PTI gate circuits comprise the $1^{st}$, $2^{nd}$, $3^{rd}$, $4^{th}$, and $6^{th}$ PTI gate circuits; The $1^{st}$, $11^{th}$, $21^{st}$ and $26^{th}$ CNFET tubes are P-type CNFET tubes; the $2^{nd}$, $3^{rd}$, $4^{th}$, $5^{th}$, $6^{th}$, $7^{th}$, $8^{th}$, $9^{th}$, $10^{th}$, $12^{th}$, $13^{th}$, $14^{h}$, $15^{th}$, $16^{th}$, $17^{th}$, $18^{th}$, $19^{th}$, $20^{th}$, $22^{nd}$, $23^{rd}$, $24^{th}$, $25^{th}$, $27^{th}$, $28^{th}$, $29^{th}$, $30^{th}$ and $31^{st}$ CNFET tubes are N-type CNFET tubes; a source a source of the $1^{st}$ CNFET tube, a source of the $11^{th}$ CNFET tube, a source of the $21^{st}$ CNFET tube are connected to the 1st supply voltage; a source of the 26th CNFET tube is connected to the 2nd supply voltage; the 2nd supply voltage is half of the 1st supply voltage; a grid of the $1^{st}$ CNFET tube, a grid of the $4^{th}$ CNFET tube, a grid of the $14^{th}$ CNFET tube and a grid of the $21^{st}$ CNFET tube and a grid of the $25^{th}$ CNFET tube are connected to the output terminal of the said double-edge pulse signal generator; a drain a drain of the $1^{st}$ CNFET tube, a drain of the $2^{nd}$ CNFET tube, a drain of the $5^{th}$ CNFET tube and a drain of the $9^{th}$ CNFET tube are connected to that of the 11th CNFET tube; a source of the 2nd CNFET tube is connected to a drain of 3rd CNFET tubes;-a source-a source of the $3^{rd}$ CNFET tube, a source of the $8^{th}$ CNFET tube and a drain of the 4th CNFET tube are connected to a source of the 10th CNFET tube; a source of the 4th CNFET tube is grounded; a source of the 5th CNFET tube is connected to a drain of the 6th CNFET tube; a source of the 6th CNFET tube is connected to a drain of the 7th CNFET tube; a source of the 7th CNFET tube is connected to a drain of the 8th CNFET tube; a source of the 9th CNFET tube is connected to a drain of the 10th CNFET tube; a drain-a drain of the $11^{th}$ CNFET tube, a drain of the $12^{th}$ CNFET tube, a drain of the $15^{th}$ CNFET tube, a drain of the $18^{th}$ CNFET tube and a drain of the $26^{th}$ CNFET tube are connected to the input terminal of the 1st three-value inverter; a source of the 12th CNFET tube is connected to a drain of the $13^{th}$ CNFET tube; a source of the $13^{th}$ CNFET tubes, a drain of $14^{th}$ CNFET tubes and a source of 17th CNFET tubes are connected to a source of the 20th CNFET tube; a source of the 15th CNFET tube is connected to a drain of the 16th CNFET tube; a source of the 16th CNFET tube is connected to a drain of the 17th CNFET tube; a source of the 18th CNFET tube is connected to a drain of the 19th CNFET tube; a source of the 19th CNFET tube is connected to a drain of the 20th CNFET tube; a source of the 14th CNFET tube is grounded; a drain of the 21st CNFET tube, a grid of the 26th CNFET, a drain of the 22nd CNFET tube and a drain of the 27th CNFET tube are connected to a drain of the 30th CNFET tube; a source of the 22nd CNFET tube is connected to a drain of the 23rd CNFET tube; a source of the 23rd CNFET tube is connected to a drain of the 24th CNFET tube; a source of the 24th CNFET tube, a drain of the 25th CNFET tube and a source of the 29th CNFET tube is connected to a source of 31 st CNFET tube; a source of the 25th CNFET tube is grounded; a source of the 27th CNFET tube is connected to a drain of the 28th CNFET tube; a source of the 28th CNFET tube is connected to a drain of the 29th CNFET tube; a source of the 30th CNFET tube is connected to a drain of the 31st CNFET tube; a grid of the 2nd CNFET tube, input terminal of the 3rd NTI gate circuit, a grid of the 22nd CNFET tube and the input terminal of the 5th PTI gate circuit are connected to a terminal J of the said JKL flip-flop; a grid of the 5th CNFET tube, an input terminal of the 1st PTI gate circuit, a grid of the 15th CNFET tube and an input terminal of the 6th NTI gate circuit are connected to a terminal K of the said JKL flip-flop; an input terminal of the $2^{nd}$ NTI gate circuit, input terminal of the $4^{th}$ PTI gate circuit, a grid of the $18^{th}$ CNFET tube are connected to a grid of the $30^{th}$ CNFET are connected to a terminal L of the said JKL flip-flop; an input terminal of the $1^{st}$ NTI circuit, input terminal of the $2^{nd}$ PTI gate circuit, a grid of the $8^{th}$ CNFET tube, a grid of the $9^{th}$ CNFET tube, input terminal of the $4^{th}$ NTI circuit, input terminal of the $3^{rd}$ PTI gate circuit, a grid of the $17^{th}$ CNFET tube, a grid of the $20^{th}$ CNFET tube, input terminal of the $5^{th}$ NTI gate circuit, input terminal of the $6^{th}$ PTI gate circuit, a grid of the $29^{th}$ CNFET tube, a grid of the $31^{st}$ CNFET tube and an output terminal of the $2^{nd}$ three-value inverter are connected to an output terminal of the said JKL flip-flop; an output terminal of the $1^{st}$ NTI gate circuit is connected to a grid of the $3^{rd}$ CNFET tube; an output terminal of the 2nd NTI gate circuit is connected to a grid of the 10th CNFET tube; an output terminal of the 1 st PTI gate circuit is connected to a grid of the 6th CNFET tube; an output terminal of the 2nd PTI gate circuit is connected to a grid of the 7th CNFET tube; an output terminal of the 3rd NTI gate circuit is connected to a grid of the 12th CNFET tube; an output terminal of the 4th NTI gate circuit is connected to a grid of the 13th CNFET tube; an output terminal of the 3rd PTI gate circuit is connected to a grid of the 16th CNFET tube; an output terminal of the 4th PTI gate circuit is connected to a grid of the 19th CNFET tube; an output terminal of the 5th PTI gate circuit is connected to a grid of the 23rd CNFET tube; an output terminal of the 5th NTI gate circuit is connected to a grid of the 24th CNFET tube; an output terminal of the 6th PTI gate circuit is connected to a grid of the 28th CNFET tube; an output terminal of the 6th NTI gate circuit is connected to a grid of the 27th CNFET tube; an output terminal of the 1st three-value inverter is connected to the input terminal of the 2nd three-value inverter.

The said NTI gate circuit comprises the 32nd and 33$^{rd}$ CNFET tubes; the 30$^{th}$ CNFET tube is a P-type CNFET tube; the 33$^{rd}$ CNFET tube is an N-type CNFET tube; a source of the 32$^{nd}$ CNFET tube is connected to the 1$^{st}$ supply voltage; a grid of the 32$^{nd}$ CNFET tube and a grid of the 33$^{rd}$ CNFET tube are connected to an input terminal of the said NTI gate circuit; a drain of the 32$^{nd}$ CNFET tube and a drain of the 33$^{rd}$ CNFET tube are connected to an output terminal of the said NTI gate circuit; a source of the 33$^{rd}$ CNFET tube is grounded.

The said PTI gate circuit comprises the 34$^{th}$ and 35$^{th}$ CNFET tubes; the 34$^{th}$ CNFET tube is a P-type CNFET tube; the 35$^{th}$ CNFET tube is an N-type CNFET tube; a source of the 34$^{th}$ CNFET tube is connected to the 1$^{st}$ supply voltage; a grid of the 34$^{th}$ CNFET tube and a grid of the 35$^{th}$ CNFET tube are connected to an input terminal of the said PTI gate circuit; a drain of the 34$^{th}$ CNFET tube is connected to a drain of the 35$^{th}$ CNFET tube are connected to an output terminal of the said PTI gate circuit; a source of the 35$^{th}$ CNFET tube is grounded.

The 1$^{st}$ three-value inverter comprises the 36$^{th}$, 37$^{th}$, 38$^{th}$, 39$^{th}$, 40$^{th}$ and 41$^{st}$ CNFET tubes; the 36$^{th}$, 37$^{th}$ and 38$^{th}$ CNFET tubes are P-type CNFET tubes; the 39$^{th}$, 40$^{th}$ and 41$^{st}$ CNFET tubes are N-type CNFET tubes; a source a source of the 36$^{th}$ CNFET tube and a source of the 37$^{th}$ CNFET tube are connected to the 1$^{st}$ supply voltage; a source a grid of the 36$^{th}$ CNFET tube, a grid of the 37$^{th}$ CNFET tube, a grid of 40 CNFET tube and a source of the 41$^{st}$ CNFET tube, are connected to the input terminal of the 1$^{st}$ three-value inverter; a drain of the 36$^{th}$ CNFET tube is connected to a drain of the 38$^{th}$ CNFET tube; a source of the 38$^{th}$ CNFET tube, a grid of the 38$^{th}$ CNFET tube, a grid of the 39$^{th}$ CNFET tube, a drain of the 39$^{th}$ CNFET tube and a drain of the 37$^{th}$ CNFET tube and a drain of the 41$^{st}$ CNFET tube are connected to the output terminal of the 1$^{st}$ three-value inverter; a source of the 39$^{th}$ CNFET tube is connected to a drain of the 40$^{th}$ CNFET tube; a source of the 40$^{th}$ and a source of the 41$^{st}$ CNFET tubes are grounded.

The double-edge pulse signal generator comprises the 1$^{st}$, 2$^{nd}$, 3$^{rd}$, 4$^{th}$ and 5$^{th}$ two-value inverters, the 42$^{nd}$, 43$^{rd}$, 44$^{th}$ and 45$^{th}$ CNFET tubes; the 42$^{nd}$ and 43$^{rd}$ CNFET tubes are P-type CNFET tubes; the 44$^{th}$ and 45$^{th}$ CNFET tubes are N-type CNFET tubes; an input terminal of the 1$^{st}$ two-value inverter, a grid of the 43$^{rd}$ CNFET tube and a source of the 44$^{th}$ CNFET tube and a grid of 45$^{th}$ CNFET tube are connected to an input terminal of the said double-edge pulse signal generator; an output terminal of the 1$^{st}$ two-value inverter is connected to an input terminal of the 2$^{nd}$ two-value inverter; an output terminal of the 2$^{nd}$ two-value inverter is connected to an input terminal of the 3$^{rd}$ two-value inverter; an output terminal of the 3$^{rd}$ two-value inverter, a grid of the 42$^{nd}$ CNFET tube and a grid of the 44$^{th}$ CNFET tube are connected to a source of the 45$^{th}$ CNFET tube; a source of the 42$^{nd}$ CNFET tube is connected to the 1$^{st}$ supply voltage; a drain of the 42$^{nd}$ CNFET tube is connected to a source of the 43$^{rd}$ CNFET tube; a drain a drain of the 43$^{rd}$ CNFET tube, a drain of the 44$^{th}$ CNFET tube, and a drain of the 45$^{th}$ CNFET tube are connected to the input terminal of the 4$^{th}$ two-value inverter; an output terminal of the 4$^{th}$ two-value inverter is connected to an input terminal of the 5$^{th}$ two-value inverter; an output terminal of the 5$^{th}$ two-value inverter is an output terminal of the said double-edge pulse signal generator.

As compared with prior art, the present invention has the following features: It makes use of clock signal accessed to the double-edge pulse signal generator clk to control the connection of JKL flip-flop; it further makes use of node Y connecting the a drains of the 1$^{st}$, 2$^{nd}$, 5$^{th}$ and 9$^{th}$ CNFET tubes and the grid of the 11$^{th}$ CNFET tube and node Z connecting the a drain of the 21$^{st}$ CNFET tube, the grid of the 26$^{th}$ CNFET tube, and the a drains of the 22$^{nd}$, 27$^{th}$ and 30$^{th}$ CNFET tubes to control jumping of JKL flip-flop among "0", "1" and "2"; this aims to reduce the power consumption while improving working efficiency of JKL flip-flop.

DESCRIPTION OF DRAWINGS

FIG. 2 (b) is the graphical diagram for NTI gate circuit of the present invention;

FIG. 2 (c) is the circuit diagram for PTI gate circuit of the present invention;

FIG. 2 (d) is the graphical diagram for PTI gate circuit of the present invention;

FIG. 3 (b) is the graphical diagram for the 1$^{st}$ three-value inverter of the present invention;

DESCRIPTION OF EMBODIMENTS

The present invention is further described as follows in combination with drawings and embodiments.

Embodiment

Figure 1:
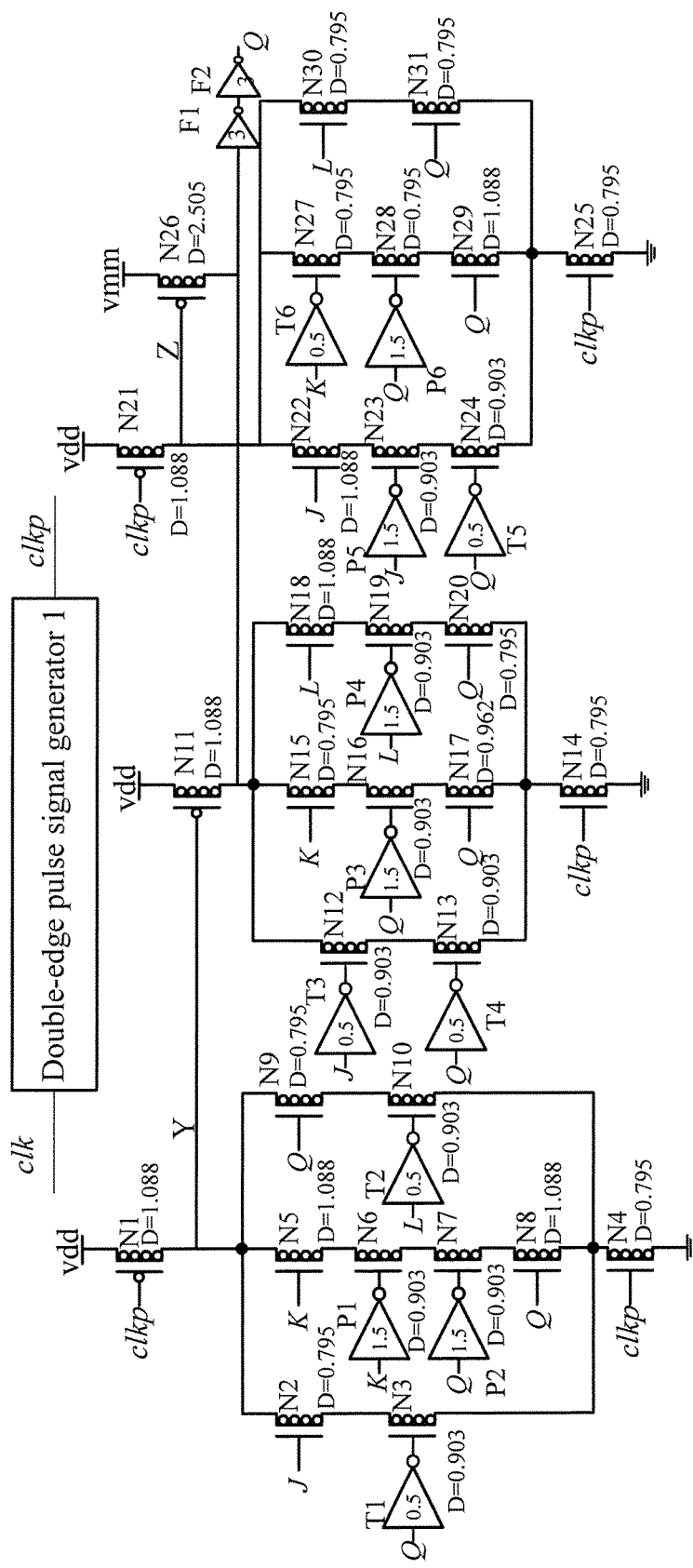
FIG. 1 is the circuit diagram of the prevent invention.
Figure 2A:
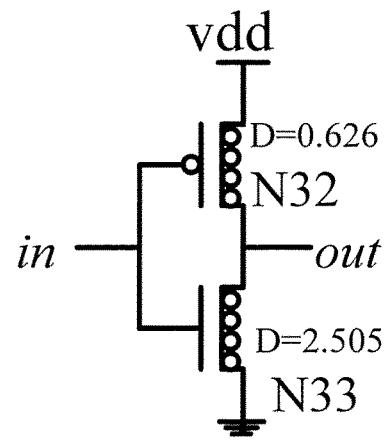
FIG. 2 (a) is the circuit diagram for NTI gate circuit of the present invention.
Figure 2B:
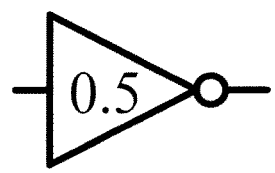
Figure 2C:
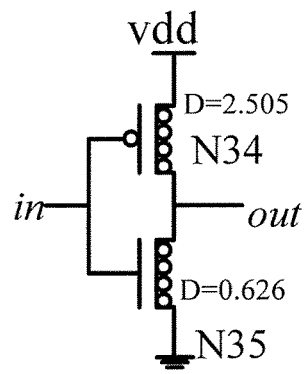
Figure 2D:
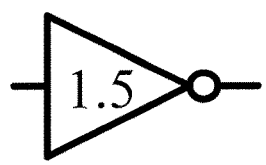

A CNFET double-edge pulse JKL flip-flop as shown in FIG. 1, comprising a double-edge pulse signal generator 1, a 1$^{st}$ CNFET tube N1, a 2$^{nd}$ CNFET tube N2, the 3$^{rd}$ CNFET tube N3, the 4$^{th}$ CNFET tube N4, the 5$^{th}$ CNFET tube N5, the 6$^{th}$ CNFET tube N6, the 7$^{th}$ CNFET tube N7, the 8$^{th}$ CNFET tube N8, the 9$^{th}$ CNFET tube N9, the 10$^{th}$ CNFET tube N10, the 11$^{th}$ CNFET tube N11, the 12$^{th}$ CNFET tube N12, the 13$^{th}$ CNFET tube N13, the 14$^{th}$ CNFET tube N14, the 15$^{th}$ CNFET tube N15, the 16$^{th}$ CNFET tube N16, the 17$^{th}$ CNFET tube N17, the 18$^{th}$ CNFET tube N18, the 19$^{th}$ CNFET tube N19, the 20$^{th}$ CNFET tube N20, the 21$^{st}$ CNFET tube N21, the 22$^{nd}$ CNFET tube N22, the 23$^{rd}$ CNFET tube N23, the 24$^{th}$ CNFET tube N24, the 25$^{th}$ CNFET tube N25, the 26$^{th}$ CNFET tube N26, the 27$^{th}$ CNFET tube N27, the 28$^{th}$ CNFET tube 28, 29$^{th}$ CNFET tube N29, the 30$^{th}$ CNFET tube N30, the 31$^{st}$ CNFET tube N31, 6 NTI gate circuits of the same circuit structure, 6 PTI gate circuits of the same circuit structure, the 1$^{st}$ three-value inverter F1 and the 2$^{nd}$ three-value inverter F2 of the same circuit structure; 6 NTI gate circuits comprise the 1$^{st}$ NTI gate circuit T1, the 2$^{nd}$ NTI gate circuit T2, the 3$^{rd}$ NTI gate circuit T3, the 4$^{th}$ NTI gate circuit T4, the 5$^{th}$ NTI gate circuit T5 and the 6$^{th}$ NTI gate circuit T6; 6 PTI gate circuits comprise the 1$^{st}$ PTI gate circuit P1, the 2$^{nd}$ PTI gate circuit P2, the 3$^{rd}$ PTI gate circuit P3, the 4$^{th}$ PTI gate circuit P4, the 5$^{th}$ PTI gate circuit P5 and the 6$^{th}$ PTI gate circuit P6; the 1$^{st}$ CNFET tube N1, the 11$^{th}$ CNFET tube N11, the 21$^{st}$ CNFET tube N21 and the 26$^{th}$ CNFET tube N26 are P-type CNFET tubes; the 2$^{nd}$ CNFET tube N2, the 3$^{rd}$ CNFET tube N3, the 4$^{th}$ CNFET tube N4, the 5$^{th}$ CNFET tube N5, the 6$^{th}$ CNFET tube N6, the 7$^{th}$ CNFET tube N7, the 8$^{th}$ CNFET tube N8, the 9$^{th}$ CNFET tube N9, the 10$^{th}$ CNFET tube N10, the 12$^{th}$ CNFET tube N12, the 13$^{th}$ CNFET tube N13, the 14$^{th}$ CNFET tube N14, the 15$^{th}$ CNFET tube N15, the 16$^{th}$ CNFET tube N16, the 17$^{th}$ CNFET tube N17, the 18$^{th}$ CNFET tube N18, the 19$^{th}$ CNFET tube N19, the 20$^{th}$ CNFET tube N20, the 22$^{nd}$ CNFET tube N22, the 23$^{rd}$ CNFET tube N23, the 24$^{th}$ CNFET tube N24, the 25$^{th}$ CNFET tube N25, the 27 CNFET tube N27, the 28$^{th}$ CNFET tube N28, the 29$^{th}$ CNFET tube N29, the 30$^{th}$ CNFET tube N30 and the 31$^{st}$ CNFET tube N31 are N-type CNFET tubes; a source of the 1$^{st}$ CNFET tube N1, a source of the 11$^{th}$ CNFET tube N11 a source of the 21$^{st}$ CNFET tube N21 are connected the 1$^{st}$ supply voltage; a source of the 26$^{th}$ CNFET tube N26 is connected to the 2$^{nd}$ supply voltage; the 2$^{nd}$ supply voltage is half of the 1$^{st}$ supply voltage; a grid of the 1$^{st}$ CNFET tube N1, a grid of the 4$^{th}$ CNFET tube N4, a grid of the 14$^{th}$ CNFET tube N14 and a grid of the 21$^{st}$ CNFET tube N21 and a grid of the 25$^{th}$ CNFET tube are connected to the output terminal of the said double-edge pulse signal generator 1; a drain of the 1$^{st}$ CNFET tube N1, a drain of the 2$^{nd}$ CNFET tube N2, a drain of the 5$^{th}$ CNFET tube N5 and a drain of the 9$^{th}$ CNFET tube N9 are connected to a grid of the 11$^{th}$ CNFET tube N11; a source of the 2$^{nd}$ CNFET tube N2 is connected to a drain of the 3$^{rd}$ CNFET tube N3; a source of the 3$^{rd}$ CNFET tube N3 and a source of the 8$^{th}$ CNFET tube N8 and a drain of the 40$^{th}$ CNFET tube N4 are connected to a source of 10$^{th}$ CNFET tube N10; a source of the 4$^{th}$ CNFET tube N4 is grounded; a source of the 5$^{th}$ CNFET tube N5 is connected to a drain of the 6$^{th}$ CNFET tube N6; a source of the 6$^{th}$ CNFET tube N6 is connected to a drain of the 7$^{th}$ CNFET tube N7; a source of the 7$^{th}$ CNFET tube N7 is connected to a drain of the 8$^{th}$ CNFET tube N8; a source of the 9$^{th}$ CNFET tube N9 is connected to a drain of the 10$^{th}$ CNFET tube N10; a drain of the 11$^{th}$ CNFET tube N11, the 12$^{th}$ CNFET tube N12, the 15$^{th}$ CNFET tube N15, the 18$^{th}$ CNFET tube N18 and the 26$^{th}$ CNFET tube N26 is connected to the input terminal of the 1$^{st}$ three-value inverter F1; a source of the 12$^{th}$ CNFET tube N12 is connected to a drain of the 13$^{th}$ CNFET tube N13; a source of the 13$^{th}$ CNFET tube N13, a drain of the 14$^{th}$ CNFET tube N14 and a source of the 17$^{th}$ CNFET tube N17 are connected to a source of the 20$^{th}$ CNFET tube N20; a source of the 15$^{th}$ CNFET tube N15 is connected to a drain of the 16$^{th}$ CNFET tube N16; a source of the 16$^{th}$ CNFET tube N16 is connected to a drain of the 17$^{th}$ CNFET tube N17; a source of the 18$^{th}$ CNFET tube N18 is connected to a drain of the 19$^{th}$ CNFET tube N19; a source of the 19$^{th}$ CNFET tube N19 is connected to a drain of the 20$^{th}$ CNFET tube N20; a source of the 14$^{th}$ CNFET tube N14 is grounded; a drain of the 21$^{st}$ CNFET tube N21, a grid of the 26$^{th}$ CNFET tube N26, a drain of the 22$^{nd}$ CNFET tube N22 and a drain of the 27$^{th}$ CNFET tube N27 are connected to a drain of the 30$^{th}$ CNFET tube N30; a source of the 22$^{nd}$ CNFET tube N22 is connected to a drain of the 23$^{rd}$ CNFET tube N23; a source of the 23$^{rd}$ CNFET tube N23 is connected to a drain of the 24$^{th}$ CNFET tube N24; a source of the 24$^{th}$ CNFET tube N24, a drain of the 25$^{th}$ CNFET tube N25 and a source of the 29$^{th}$ CNFET tube N29 are connected to a source of 31$^{st}$ CNFET tube N31; a source of the 25$^{th}$ CNFET tube N25 is grounded; a source of the 27$^{th}$ CNFET tube N27 is connected to a drain of the 28$^{th}$ CNFET tube N28; a source of the 28$^{th}$ CNFET tube N28 is connected to a drain of the 29$^{th}$ CNFET tube N29; a source of the 30$^{th}$ CNFET tube N30 is connected to a drain of the 31$^{st}$ CNFET tube N31; a grid of the 2$^{nd}$ CNFET tube N2, an input terminal of the 3$^{rd}$ NTI gate circuit T3, a grid of the 22$^{nd}$ CNFET tube N22 and an input terminal of the 5$^{th}$ PTI gate circuit P5 are connected to a terminal J of the said JKL flip-flop; a grid of the 5$^{th}$ CNFET tube N5, an input terminal of the 1$^{st}$ PTI gate circuit P1, a grid of the 15$^{th}$ CNFET tube N15 and an input terminal of the 6$^{th}$ NTI gate circuit T6 are connected to a terminal K of JKL flip-flop; an input terminal of the 2$^{nd}$ NTI gate circuit T2, an input terminal of the 4$^{th}$ PTI gate circuit P4, a grid of the 18$^{th}$ CNFET tube N18 and a grid of the 30$^{th}$ CNFET tube N30 are connected to a terminal L of JKL flip-flop; an input terminal of the 1$^{st}$ NTI gate circuit T1, an input terminal of the 2$^{nd}$ PTI gate circuit P2, a grid of the 8$^{th}$ CNFET tube N8, a grid of the 9$^{th}$ CNFET tube N9, an input terminal of the 4$^{th}$ NTI gate circuit T4, an input terminal of the 3$^{rd}$ PTI gate circuit P3, a grid of the 17$^{th}$ CNFET tube N17, a grid of the 20$^{th}$ CNFET tube N20, an input terminal of the 5$^{th}$ NTI gate circuit T5, an input terminal of the 6$^{th}$ PTI gate circuit P6, a grid of the 29$^{th}$ CNFET tube N29 and a grid of the 31$^{st}$ CNFET tube N31 are connected to an output terminal of the 2$^{nd}$ three-value inverter F2 are connected to an output terminal of JKL flip-flop; an output terminal of the 1$^{st}$ NTI gate circuit T1 is connected to a grid of the 3$^{rd}$ CNFET tube N3; an output terminal of the 2$^{nd}$ NTI gate circuit T2 are connected to a grid of the 10$^{th}$ CNFET tube N10; an output terminal of the 1$^{st}$ PTI gate circuit P1 is connected to a grid of the 6$^{th}$ CNFET tube N6; an output terminal of the 2$^{nd}$ PTI gate circuit P2 is connected to a grid of the 7$^{th}$ CNFET tube N7; an output terminal of the 3$^{rd}$ NTI gate circuit is connected to a grid of the 12$^{th}$ CNFET tube N12; an output terminal of the 4$^{th}$ NTI gate circuit T4 is connected to a grid of the 13$^{th}$ CNFET N13; an output terminal of the 3$^{rd}$ PTI gate circuit P3 is connected to a grid of the 16$^{th}$ CNFET tube N16; an output terminal of the 4$^{th}$ PTI gate circuit P4 is connected to a grid of the 19$^{th}$ CNFET tube N19; an output terminal of the 5$^{th}$ PTI gate circuit P5 is connected to a grid of the 23$^{rd}$ CNFET tube N23; an output terminal of the 5$^{th}$ NTI gate circuit P5 is connected to a grid of the 24$^{th}$ CNFET tube N24; an output terminal of the 6$^{th}$ PTI gate circuit is connected to a grid of the 28$^{th}$ CNFET tube N28; an output terminal of the 6$^{th}$ NTI gate circuit T6 is connected to a grid of the 27$^{th}$ CNFET tube N27; an output terminal of the 1$^{st}$ three-value inverter F1 is connected to the input terminal of the 2$^{nd}$ three-value inverter F2.

As shown in FIGS. 2 (a) and (b), NTI gate circuit in this embodiment comprises the said 32$^{nd}$ CNFET tube N32 and the 33$^{rd}$ CNFET tube N33; the 32$^{nd}$ CNFET tube N32 is a P-type CNFET tube; the 33$^{rd}$ CNGET tube N33 is an N-type CNFET tube; a source of the 32$^{nd}$ CNFET tube N32 is connected to the 1$^{st}$ supply voltage; a grid of the 32$^{nd}$ CNFET tube N32 and a grid of the 33$^{rd}$ CNFET tube N33 are connected to an input terminal of the NTI gate circuit; a drain of the 32$^{nd}$ CNFET tube N32 is connected to a drain of the 33$^{rd}$ CNFET tube N33 are connected to an output terminal of NTI gate circuit; a source of the 33$^{rd}$ CNFET tube N33 is grounded.

As shown in FIGS. 2 (c) and (d), PTI gate circuit in this embodiment comprises the 34$^{th}$ CNFET tube N34 and the 35$^{th}$ CNFET tube N35; the 34$^{th}$ CNFET tube N34 is a P-type CNFET tube; the 35$^{th}$ CNFET tube N35 is an N-type CNFET tube; a source of the 34$^{th}$ CNFET tube N34 is connected to the 1$^{st}$ supply voltage; a grid of the 34$^{th}$ CNFET tube N34 and a grid of the 35$^{th}$ CNFET tube N35 are connected to an input terminal of PTI gate circuit; a drain of the 34$^{th}$ CNFET tube N34 and a drain of the 35$^{th}$ CNFET tube N35 are connected to an output terminal of PTI gate circuit; a source of the 35$^{th}$ CNFET tube N35 is grounded.

Figure 3:
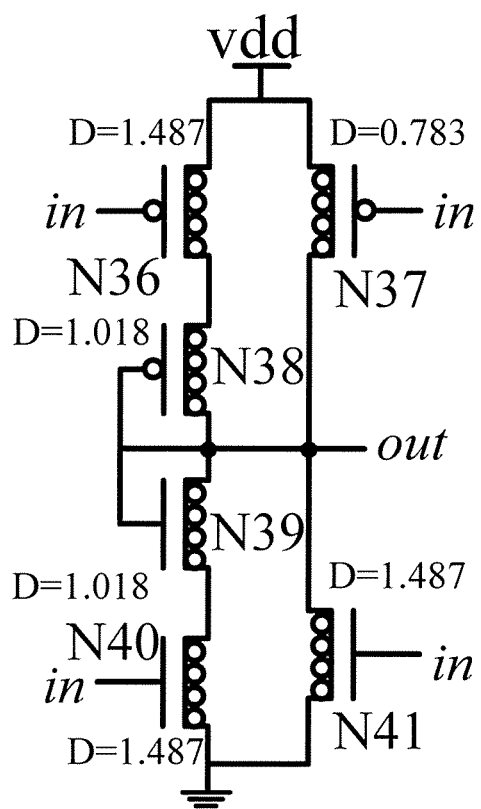
FIG. 3 (a) is the circuit diagram for the 1$^{st}$ three-value inverter of the present invention.
Figure 3:
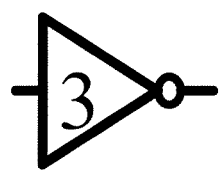

As shown in FIGS. 3 (a) and (b), the 1$^{st}$ three-value inverter F1 in this embodiment comprises the 36$^{th}$ CNFET tube N36, the 37$^{th}$ CNFET tube N37, the 38$^{th}$ CNFET tube N38, the 39$^{th}$ CNFET tube N39, the 40$^{th}$ CNFET tube N40 and the 41$^{st}$ CNGET tube N41; the 36$^{th}$ CNFET tube N36, the 37$^{th}$ CNFET tube N37 and the 38$^{th}$ CNFET tube N38 are P-type CNFET tubes; the 329$^{th}$ CNFET tube N39, the 40$^{th}$ CNFET tube N40 and the 41$^{st}$ CNFET tube N41 are N-type CNFET tubes; a source of the 36$^{th}$ CNFET tube N36 and a source of the 37$^{th}$ CNFET tube N37 are connected to the 1$^{st}$ supply voltage; a grid of the 36$^{th}$ CNFET tube N36, a grid of the 37$^{th}$ CNFET tube N37, a grid of the 40$^{th}$ CNFET tube N40, a grid of the 41$^{st}$ CNFET tube N41 are connected to an input terminal of the 1$^{st}$ three-value inverter F1; a drain of the 36$^{th}$ CNFET tube N36 is connected to a drain of the 38$^{th}$ CNFET tube N38; a source of the 38$^{th}$ CNFET tube N38, a grid of the 38$^{th}$ CNFET tube N38, a grid of the 39$^{th}$ CNFET tube N39, a drain of the 39$^{th}$ CNFET tube N39 and a drain of the 37$^{th}$ CNFET tube N37 and a drain of the 41$^{st}$ CNFET tube N41 are connected to an output terminal of the 1$^{st}$ three-value inverter F1; a source of the 39$^{th}$ CNFET tube N39 is connected to a drain of the 40$^{th}$ CNFET tube N40; a source of the 40$^{th}$ CNFET tube N40 and a source of the 41$^{st}$ CNFET tube N41 are grounded.

Figure 4:
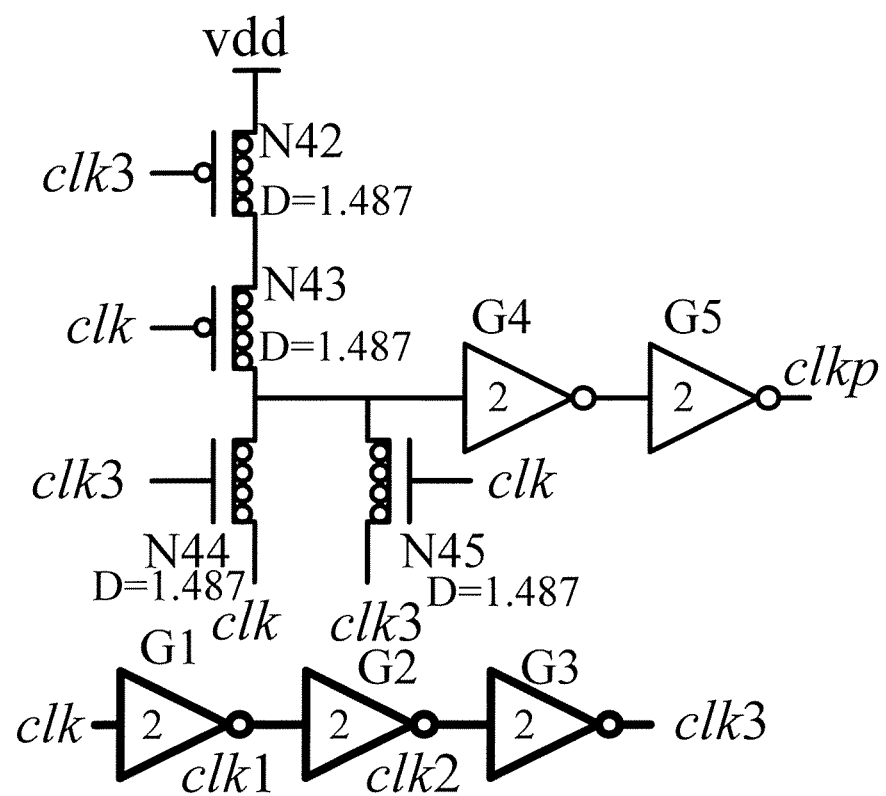
FIG. 4 is the circuit diagram for the double-edge pulse signal generator of the present invention.

As shown in FIG. 4, the double-edge pulse signal generator 1 in this embodiment comprises the 1$^{st}$ two-value inverter G1, the 2$^{nd}$ two-value inverter G2, the 3$^{rd}$ two-value inverter G3, the 4$^{th}$ two-value inverter G4, the 5$^{th}$ two-value inverter G5, the 42$^{nd}$ CNFET tube N42, the 43$^{rd}$ CNFET tube N43, the 44$^{th}$ CNFET tube N44 and the 45$^{th}$ CNFET tube N45; the 42$^{nd}$ CNFET tube N42 and the 43$^{rd}$ CNFET tube N43 are P-type CNFET tubes; the 44$^{th}$ CNFET tube N44 and the 35$^{th}$ CNFET tube N45 are N-type CNFET tubes; an input terminal of the 1$^{st}$ two-value inverter G1, a grid of the 43$^{rd}$ CNFET tube N43 and a source of the 44$^{th}$ CNFET tube N44 and a grid of the 45$^{th}$ CNFET tube N45 are connected to an input terminal of the double-edge pulse signal generator 1; an output terminal of the 1$^{st}$ two-value inverter G1 is connected to an input terminal of the 2$^{nd}$ two-value inverter G2; an output terminal of the 2$^{nd}$ two-value inverter G2 is connected to an input terminal of the 3$^{rd}$ two-value inverter G3; an output terminal of the 3$^{rd}$ two-value inverter G3, a grid of the 42$^{nd}$ CNFET tube N43 and a grid of the 44$^{th}$ CNFET tube N44 are connected to a source of the 45$^{th}$ CNFET tube N45; a source of the 42$^{nd}$ CNFET tube N42 is connected to the 1$^{st}$ supply voltage; a drain of the 42$^{nd}$ CNFET tube N42 is connected to a source of the 43$^{rd}$ CNFET tube N43; a drain of the 43$^{rd}$ CNFET tube N43, a drain of the 44$^{th}$ CNFET tube N44 and a drain of the 45$^{th}$ CNFET tube N45 are connected to an input terminal of the 4$^{th}$ two-value inverter G4; an output terminal of the 4$^{th}$ two-value inverter G4 is connected to an input terminal of the 5$^{th}$ two-value inverter G5; an output terminal of the 5$^{th}$ two-value inverter G5 is an output terminal of the double-edge pulse signal generator 1.

In this embodiment, the 1$^{st}$ supply voltage is 0.9V, and the 2$^{nd}$ supply voltage is 0.45V.

In aforesaid embodiments, caliber (diameter) of each CNFET tube is as shown in figures; caliber unit D is nm.

What is claimed is:

1. A CNFET double-edge pulse JKL flip-flop, comprising: a double-edge pulse signal generator; 1$^{st}$, 2$^{nd}$, 3$^{rd}$, 4$^{th}$, 5$^{th}$, 6$^{th}$, 7$^{th}$, 8$^{th}$, 9$^{th}$, 10$^{th}$, 11$^{th}$, 12$^{th}$, 13$^{th}$, 14$^{th}$, 15$^{th}$, 16$^{th}$, 17$^{th}$, 18$^{th}$, 19$^{th}$, 20$^{th}$, 21$^{st}$, 22$^{nd}$, 23$^{rd}$, 24$^{th}$, 25$^{th}$, 26$^{th}$, 27$^{th}$, 28$^{th}$, 29$^{th}$, 30$^{th}$ and 31$^{st}$ CNFET tubes; 6 NTI gate circuits having the same circuit structure; 6 PTI gate circuits having the same circuit structure; 1$^{st}$ and 2$^{nd}$ three-value inverters having the same circuit structure, wherein the 6 NTI gate circuits comprise the 1$^{st}$, 2$^{nd}$, 3$^{rd}$, 4$^{th}$, 5$^{th}$ and 6$^{th}$ NTI gate circuits, and the 6 PTI gate circuits comprise the 1$^{st}$, 2$^{nd}$, 3$^{rd}$, 4$^{th}$, 5$^{th}$ and 6$^{th}$ PTI gate circuits, wherein the 1$^{st}$, 11$^{th}$, 21$^{st}$ and 26$^{th}$ CNFET tubes are P-type CNFET tubes, the 2$^{nd}$, 3$^{rd}$, 4$^{th}$, 5$^{th}$, 6$^{th}$, 7$^{th}$, 8$^{th}$, 9$^{th}$, 10$^{th}$, 12$^{th}$, 13$^{th}$, 14$^{th}$, 15$^{th}$, 16$^{th}$, 17$^{th}$, 18$^{th}$, 19$^{th}$, 20$^{th}$, 22$^{nd}$, 23$^{rd}$, 24$^{th}$, 25$^{th}$, 27$^{th}$, 28$^{th}$, 29$^{th}$, 30$^{th}$ and 31$^{st}$ CNFET tubes are N-type CNFET tubes, wherein a source of the 1$^{st}$ CNFET tube, a source of the 11$^{th}$ CNFET tube, a source of the 21$^{st}$ CNFET tube are connected to a 1$^{st}$ supply voltage; a source of the 26$^{th}$ CNFET tube is connected to a 2$^{nd}$ supply voltage; and the 2$^{nd}$ supply voltage is half of the 1$^{st}$ supply voltage; a grid of the 1$^{st}$ CNFET tube, a grid of the 4$^{th}$ CNFET tube, a grid of the 14$^{th}$ CNFET tube and a grid of the 21$^{st}$ CNFET tube and a grid of the 25$^{th}$ CNFET tube are connected to an output terminal of the said double-edge pulse signal generator; a drain of the 1$^{st}$ CNFET tube, a drain of the 2$^{nd}$ CNFET tube, a drain of the 5$^{th}$ CNFET tube and a drain of the 9$^{th}$ CNFET tube are connected to a grid of the 11$^{th}$ CNFET tube; a source of the 2$^{nd}$ CNFET tube is connected to a drain of the 3$^{rd}$ CNFET tube; a source of the 3$^{rd}$ CNFET tube, a source of the 8$^{th}$ CNFET tube and a drain of the 4$^{th}$ CNFET tube are connected to a source of 10$^{th}$ CNFET tube; a source of the 4$^{th}$ CNFET tube is grounded; a source of the 5$^{th}$ CNFET tube is connected to a drain of the 6$^{th}$ CNFET tube; a source of the 6$^{th}$ CNFET tube is connected to a drain of the 7$^{th}$ CNFET tube; a source of a 7$^{th}$ CNFET tube is connected to a drain of the 8$^{th}$ CNFET tube; a source of the 9$^{th}$ CNFET tube is connected to a drain of the 10$^{th}$ CNFET tube; a drain of the 11$^{th}$ CNFET tube, a drain of the 12$^{th}$ CNFET tube, a drain of the 15$^{th}$ CNFET tube, a drain of the 18$^{th}$ CNFET tube and a drain of the 26$^{th}$ CNFET tube are connected to an input terminal of the 1$^{st}$ three-value inverter; a source of the 12$^{th}$ CNFET tube is connected to a drain of the 13$^{th}$ CNFET tube; wherein a source of the 13$^{th}$ CNFET tube, a drain of the 14$^{th}$ CNFET tube and a source of the 17$^{th}$ CNFET tubes are connected to a source of the 20$^{th}$ CNFET tube; a source of the 15$^{th}$ CNFET tube is connected to a drain of the 16$^{th}$ CNFET tube; a source of the 16$^{th}$ CNFET tube is connected to a drain of the 17$^{th}$ CNFET tube; a source of the 18$^{th}$ CNFET tube is connected to a drain of the 19$^{th}$ CNFET tube; a source of the 19$^{th}$ CNFET tube is connected to a drain of the 20$^{th}$ CNFET tube; a source of the 14$^{th}$ CNFET tube is grounded; a drain of the 21$^{st}$ CNFET tube, a grid of the 26$^{th}$ CNFET, a drain of the 22$^{nd}$ CNFET tube and a drain of the 27$^{th}$ CNFET tube are connected to a drain of the 30$^{th}$ CNFET tube; a source of the 22$^{nd}$ CNFET tube is connected to a drain of the 23$^{rd}$ CNFET tube; a source of the 23$^{rd}$ CNFET tube is connected to a drain of the 24$^{th}$ CNFET tube; a source of the 24$^{th}$ CNFET tube, a drain of the 25$^{th}$ CNFET tube and a source of the 29$^{th}$ CNFET tube are connected to a source of 31$^{st}$ CNFET tube; a source of the 25$^{th}$ CNFET tube is grounded; a source of the 27$^{th}$ CNFET tube is connected to a drain of the 28$^{th}$ CNFET tube; a source of the 28$^{th}$ CNFET tube is connected to a drain of the 29$^{th}$ CNFET tube; a source of the 30$^{th}$ CNFET tube is connected to a drain of the 31$^{st}$ CNFET tube; a grid of the 2$^{nd}$ CNFET tube, an input terminal of the 3$^{rd}$ NTI gate circuit, a grid of the 22$^{nd}$ CNFET tube and an input terminal of the 5$^{th}$ PTI gate circuit are connected to a terminal J of the said JKL flip-flop; a grid of the 5$^{th}$ CNFET tube, an input terminal of the 1$^{st}$ PTI gate circuit, a grid of the 15$^{th}$ CNFET tube and an input terminal of the 6$^{th}$ NTI gate circuit are connected to a terminal K of the said JKL flip-flop; an input terminal of the 2$^{nd}$ NTI gate circuit, an input terminal of the 4$^{th}$ PTI gate circuit, a grid of the 18$^{th}$ CNFET tube and a grid of the 30$^{th}$ CNFET are connected to a terminal L of the said JKL flip-flop; an input terminal of the 1$^{st}$ NTI circuit, an input terminal of the 2$^{nd}$ PTI gate circuit, a grid of the 8$^{th}$ CNFET tube, a grid of the 9$^{th}$ CNFET tube, an input terminal of the 4$^{th}$ NTI circuit, an input terminal of the 3$^{rd}$ PTI gate circuit, a grid of the 17$^{th}$ CNFET tube, a grid of the 20$^{th}$ CNFET tube, an input terminal of the 5$^{th}$ NTI gate circuit, an input terminal of the 6$^{th}$ gate circuit, a grid of the 29$^{th}$ CNFET tube, a grid of the 31$^{st}$ CNFET tube and an output terminal of the 2$^{nd}$ three-value inverter are connected to an output terminal of the said JKL flip-flop; an output terminal of the 1$^{st}$ NTI gate circuit is connected to a grid of the 3$^{rd}$ CNFET tube; an output terminal of the 2$^{nd}$ NTI gate circuit is connected to a grid of the 10$^{th}$ CNFET tube; an output terminal of the 1$^{st}$ PTI gate circuit is connected to a grid of the 6$^{th}$ CNFET tube; an output terminal of the 2$^{nd}$ PTI gate circuit is connected to a grid of the 7$^{th}$ CNFET tube; an output terminal of the 3$^{rd}$ NTI gate circuit is connected to a grid of the 12$^{th}$ CNFET tube; an output terminal of the 4$^{th}$ NTI gate circuit is connected to a grid of the 13$^{th}$ CNFET tube; an output terminal of the 3$^{rd}$ PTI gate circuit is connected to a grid of the 16$^{th}$ CNFET tube; an output terminal of the 4$^{th}$ PTI gate circuit is connected to a grid of the 19$^{th}$ CNFET tube; an output terminal of the 5th PTI gate circuit is connected to a grid of the 23rd CNFET tube; an output terminal of the 5th NTI gate circuit is connected to a grid of the 24th CNFET tube; an output terminal of the 6th PTI gate circuit is connected to a grid of the 28th CNFET tube; an output terminal of the 6th NTI gate circuit is connected to a grid of the 27th CNFET tube; an output terminal of the 1st three-value inverter is connected to an input terminal of the 2nd three-value inverter.

2. The CNFET double-edge pulse JKL flip-flop according to claim 1, wherein the said NTI gate circuit comprises 32nd and 33$^{rd}$ CNFET tubes; the 32nd CNFET tube is a P-type CNFET tube; the 33$^{rd}$ CNFET tube is an N-type CNFET tube; a source of the 32$^{nd}$ CNFET tube is connected to the 1$^{st}$ supply voltage; a grid of the 32$^{nd}$ CNFET tube and a grid of the 33$^{rd}$ CNFET tube are connected to an input terminal of the said NTI gate circuit; a drain of the 32$^{nd}$ CNFET tube and a drain of the 33$^{rd}$ CNFET tube are connected to an output terminal of the said NTI gate circuit; a source of the 33$^{rd}$ CNFET tube is grounded.

3. The CNFET double-edge pulse JKL flip-flop according to claim 1, wherein the said PTI gate circuit comprises 34$^{th}$ and 35$^{th}$ CNFET tubes; the 34$^{th}$ CNFET tube is a P-type CNFET tube; the 35$^{th}$ CNFET tube is an N-type CNFET tube; a source of the 34$^{th}$ CNFET tube is connected to the 1$^{st}$ supply voltage; a grid of the 34$^{th}$ CNFET tube and a grid of the 35$^{th}$ CNFET tube are connected to an input terminal of the said PTI gate circuit; a drain of the 34$^{th}$ CNFET tube and a drain of the 35$^{th}$ CNFET tube are connected to an output terminal of the said PTI gate circuit; a source of the 35$^{th}$ CNFET tube is grounded.

4. The CNFET double-edge pulse JKL flip-flop according to claim 1, wherein the 1$^{st}$ three-value inverter comprises 36$^{th}$, 37$^{th}$, 38$^{th}$, 39$^{th}$, 40$^{th}$ and 41$^{st}$ CNFET tubes; the 36$^{th}$, 37$^{th}$ and 38$^{th}$ CNFET tubes are P-type CNFET tubes; the 39$^{th}$, 40$^{th}$ and 41$^{st}$ CNFET tubes are N-type CNFET tubes; a source of the 36$^{th}$ CNFET tube and a source of the 37$^{th}$ CNFET tube are connected to the 1$^{st}$ supply voltage; a grid of the 36$^{th}$ CNFET tube, a grid of the 37$^{th}$ CNFET tube, a grid of 40 CNFET tube and a grid of the 41$^{st}$ CNFET tube are connected to the input terminal of the 1$^{st}$ three-value inverter; a drain of the 36$^{th}$ CNFET tube is connected to a drain of the 38$^{th}$ CNFET tube; a source of the 38$^{th}$ CNFET tube, a grid of the 38$^{th}$ CNFET tube, a grid of the 39$^{th}$ CNFET tube, a drain of the 39$^{th}$ CNFET tube, a drain of the 37$^{th}$ CNFET tube and a drain of the 41$^{st}$ CNFET tube are connected to the output terminal of the 1$^{st}$ three-value inverter; a source of the 39$^{th}$ CNFET tube is connected to a drain of the 40$^{th}$ CNFET tube; a source of the 40$^{th}$ and a source of the 41$^{st}$ CNFET tubes are grounded.

5. The CNFET double-edge pulse JKL flip-flop according to claim 1, wherein the double-edge pulse signal generator comprises 1$^{st}$, 2$^{nd}$, 3$^{rd}$, 4$^{th}$ and 5$^{th}$ two-value inverters, and 42$^{nd}$, 43$^{rd}$, 44$^{th}$ and 45$^{th}$ CNFET tubes; the 42$^{nd}$ and 43$^{rd}$ CNFET tubes are P-type CNFET tubes; the 44$^{th}$ and 45$^{th}$ CNFET tubes are N-type CNFET tubes; an input terminal of the 1$^{st}$ two-value inverter, a grid of the 43$^{rd}$ CNFET tube and a source of the 44$^{th}$ CNFET tube and a grid of 45$^{th}$ CNFET tube are connected to an input terminal of the said double-edge pulse signal generator; an output terminal of the 1$^{st}$ two-value inverter is connected to an input terminal of the 2$^{nd}$ two-value inverter; an output terminal of the 2$^{nd}$ two-value inverter is connected to an input terminal of the 3$^{rd}$ two-value inverter; an output terminal of the 3$^{rd}$ two-value inverter, a grid of the 42$^{nd}$ CNFET tube and a grid of the 44$^{th}$ CNFET tube are connected to a grid of the 45$^{th}$ CNFET tube; a source of the 42$^{nd}$ CNFET tube is connected to the 1$^{st}$ supply voltage; a drain of the 42$^{nd}$ CNFET tube is connected to a source of the 43$^{rd}$ CNFET tube; a drain of the 43$^{rd}$ CNFET tube, a drain of the 44$^{th}$ CNFET tube, and a drain of the 45$^{th}$ CNFET tube are connected to an input terminal of the 4$^{th}$ two-value inverter; an output terminal of the 4$^{th}$ two-value inverter is connected to an input terminal of the 5$^{th}$ two-value inverter; an output terminal of the 5$^{th}$ two-value inverter is the output terminal of the said double-edge pulse signal generator.

* * * * *